(12) United States Patent
Shimizu et al.

(10) Patent No.: US 10,672,622 B2
(45) Date of Patent: Jun. 2, 2020

(54) ETCHING METHOD AND ETCHING APPARATUS

(71) Applicant: TOKYO ELECTRON LIMITED, Tokyo (JP)

(72) Inventors: Yusuke Shimizu, Miyagi (JP); Akinori Kitamura, Miyagi (JP); Masahiko Takahashi, Gyeonggi-do (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 11 days.

(21) Appl. No.: 16/116,267

(22) Filed: Aug. 29, 2018

(65) Prior Publication Data
US 2019/0067031 A1 Feb. 28, 2019

(30) Foreign Application Priority Data

Aug. 30, 2017 (JP) ................. 2017-165413

(51) Int. Cl.
*H01L 21/311* (2006.01)
*H01J 37/32* (2006.01)

(52) U.S. Cl.
CPC .... *H01L 21/31138* (2013.01); *H01J 37/3222* (2013.01); *H01J 37/32201* (2013.01); *H01J 37/32229* (2013.01); *H01J 37/32238* (2013.01); *H01J 37/32449* (2013.01); *H01J 37/32458* (2013.01); *H01J 37/32834* (2013.01); *H01L 21/31144* (2013.01); *H01J 2237/3341* (2013.01)

(58) Field of Classification Search
CPC ......... H01J 2237/3341; H01J 37/32201; H01J 37/3222; H01J 37/32229; H01J 37/32238; H01J 37/32449; H01J 37/32458; H01J 37/32834; H01L 21/31138; H01L 21/31144
USPC ....... 438/706, 710, 712, 714, 719, 723, 736; 156/345.24, 345.26, 345.28
See application file for complete search history.

(56) References Cited

U.S. PATENT DOCUMENTS

| 6,930,047 B2 * | 8/2005 | Yamazaki | ............... C03C 15/00 438/706 |
| 2010/0009542 A1 * | 1/2010 | Honda | ................ H01L 21/0212 438/702 |

(Continued)

FOREIGN PATENT DOCUMENTS

| JP | 2014-7281 A | 1/2014 |
| JP | 2016-92102 A | 5/2016 |

*Primary Examiner* — Lah Vinh
(74) *Attorney, Agent, or Firm* — Rothwell, Figg, Ernst & Manbeck, P.C.

(57) ABSTRACT

An etching method includes loading, first and second supplying, removing and etching steps. In the loading step, a target object is loaded into a chamber. In the first supply step, a first gas containing carbon, hydrogen and fluorine is supplied into the chamber. In the modification step, plasma of the first gas is generated to modify a surface of a mask film and a surface of an organic film which is not covered with the mask film. In the second supply step, a second gas for etching the organic film is supplied into the chamber. In the removal step, a modified layer formed on the surface of the organic film is removed by applying a first high frequency bias power. In the etching step, the organic film below the modified layer is etched by applying a second high frequency bias power lower than the first high frequency bias power.

12 Claims, 12 Drawing Sheets

(56) References Cited

U.S. PATENT DOCUMENTS

2013/0267097 A1* 10/2013 Srivastava .......... H01L 21/0273
438/710
2015/0104957 A1    4/2015 Takachi et al.
2016/0126071 A1    5/2016 Kitamura et al.
2017/0140923 A1*   5/2017 Watanabe ............. G03F 7/0752

* cited by examiner

ETCHING METHOD AND ETCHING APPARATUS

CROSS-REFERENCE TO RELATED APPLICATIONS

This application claims priority to Japanese Patent Application No. 2017-165413 filed on Aug. 30, 2017, the entire contents of which are incorporated herein by reference.

FIELD OF THE INVENTION

The present disclosure relates to an etching method and an etching apparatus.

BACKGROUND OF THE INVENTION

There is known a technique of etching a target object having an organic film on a base film by plasma in a predetermined pattern while using a mask film formed on the organic film as a mask. However, in the case of etching using plasma, the mask film is damaged by the plasma and, thus, a dimension of the pattern of the mask film is changed. Accordingly, CD (Critical Dimension) of a groove formed in the organic film by using the mask film is increased. Therefore, there is known a technique of curing a mask film by plasma of $H_2$ gas or $CH_3F$ gas (see, e.g., Japanese Patent Application Publication Nos. 2016-92102 and 2014-7281).

When the target object is processed by plasma of $CH_3F$ gas, the surface of the organic film which is not covered with the mask film is also cured. Therefore, an etching rate of the organic film is decreased by the process of curing the mask film, which may result in so-called etching stop in which the etching does not proceed.

In order to increase the etching rate, a high frequency bias power for ion attraction may be increased. However, an increase in the etching rate leads to a decrease in a selectivity between the organic film and the base film. Therefore, it is difficult to etch the organic film while suppressing damages inflicted on the base film, particularly in a target object in which a thickness of the organic film is not uniform.

SUMMARY OF THE INVENTION

In accordance with an aspect, there is provided an etching method including a loading step, a first supply step, a second supply step, a removal step and an etching step. In the loading step, a target object including a base film, a first organic film and a mask film that are laminated is loaded into a chamber and mounted on a stage in the chamber. In the first supply step, a first gas containing carbon, hydrogen and fluorine is supplied into the chamber. In the modification step, plasma of the first gas in the chamber is generated to modify a surface of the mask film and a surface of the first organic film which is not covered with the mask film. In the second supply step, a second gas for etching the first organic film is supplied into the chamber. In the removal step, a modified layer formed on the surface of the first organic film which is not covered with the mask film is removed by applying a first high frequency bias power to the stage and generating plasma of the second gas in the chamber. In the etching step, the first organic film below the removed modified layer is etched by applying a second high frequency bias power lower than the first high frequency bias power to the stage and generating plasma of the second gas in the chamber.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
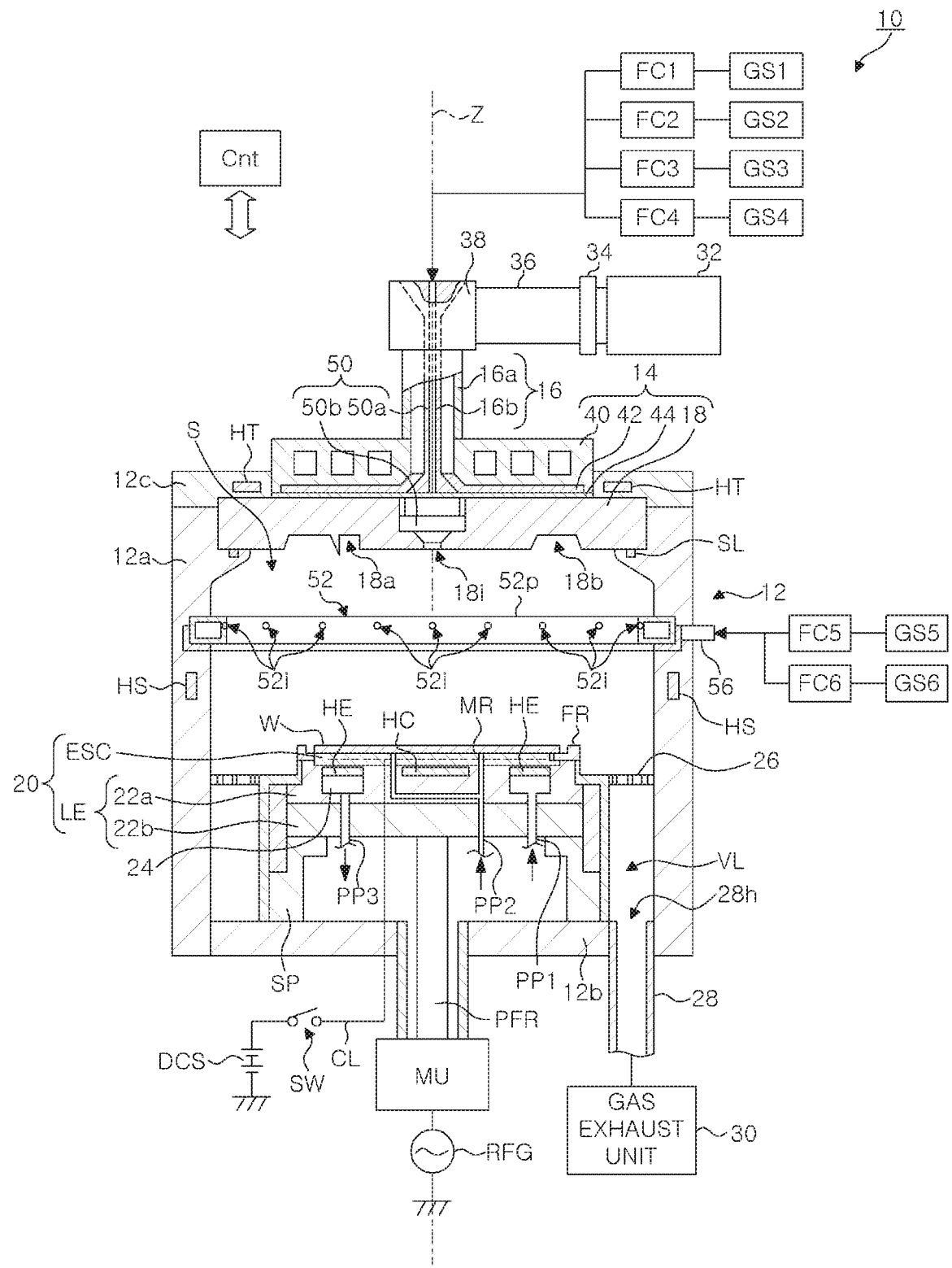
FIG. 1 is a schematic cross sectional view showing an example of an etching apparatus.

An etching method of the present disclosure includes: a loading step of loading a target object including a base film, a first organic film and a mask film that are laminated into a chamber and mounting the target object on a stage in the chamber; a first supply step of supplying a first gas containing carbon, hydrogen and fluorine into the chamber; a modification step of generating plasma of the first gas in the chamber and modifying a surface of the mask film and a surface of the first organic film which is not covered with the mask film; a second supply step of supplying a second gas for etching the first organic film into the chamber; a removal step of removing a modified layer formed on the surface of the first organic film which is not covered with the mask film by applying a first high frequency bias power to the stage and generating plasma of the second gas in the chamber; and an etching step of etching the first organic film below the removed modified layer by applying a second high frequency bias power lower than the first high frequency bias power to the stage and generating plasma of the second gas in the chamber.

The mask film may be a second organic film.

The first high frequency bias power applied to the stage in the removal step may be 100 W or above.

The first gas may contain a hydrofluorocarbon gas.

The hydrofluorocarbon gas may be represented by a chemical formula $C_xH_yF_z$ (x, y and z being natural numbers), the valence y being greater than the valence z.

The hydrofluorocarbon gas may contain at least one of $CH_3F$ and $CH_2F_2$.

The second gas may contain nitrogen and hydrogen.

The second gas may be a mixed gas of $N_2$ gas and $H_2$ gas.

The base film may include a metal film in contact with the first organic film.

The plasma generated in the modification step, the plasma generated in the removal step and the plasma generated in the etching step may be generated by a microwave radiated into the chamber through an RLSA (Radial Line Slot Antenna).

An etching apparatus of the present disclosure includes: a chamber; a stage, provided in the chamber, configured to mount thereon a target object including a base film, a first organic film and a mask film that are laminated; a first supply unit configured to supply a first gas containing carbon, hydrogen and fluorine into the chamber; a second supply unit configured to supply a second gas for etching the first organic film into the chamber; a plasma generation unit configured to generate plasma of the first gas or the second gas in the chamber; and a control unit configured to control the first supply unit, the second supply unit and the plasma generation unit. The control unit executes: a first supply step of supplying the first gas into the chamber in a state where the target object is mounted on the stage; a modification step of generating plasma of the first gas in the chamber and modifying a surface of the mask film and a surface of the first organic film which is not covered with the mask film; a second supply step of supplying a second gas into the chamber; a removal step of removing a modified layer formed on the surface of the first organic film which is not covered with the mask film by applying a first high frequency bias power to the stage and generating plasma of the second gas in the chamber; and an etching step of etching the first organic film below the removed modified layer by applying a second high frequency bias power lower than the first high frequency bias power to the stage and generating plasma of the second gas in the chamber.

Hereinafter, embodiments of an etching method and an etching apparatus will be described in detail with reference to the accompanying drawings. The following embodiments are not intended to limit the etching method and the etching apparatus of the present disclosure.

(Configuration of Etching Apparatus 10)

FIG. 1 is a cross sectional view schematically showing an example of an etching apparatus 10. As shown in FIG. 1, for example, the etching apparatus 10 includes a chamber 12. The chamber 12 provides a processing space S for accommodating a wafer W that is an example of a target object. The chamber 12 has a sidewall 12a, a bottom portion 12b, and a ceiling portion 12c. The sidewall 12a has a substantially cylindrical shape having the Z-axis as an axis line. The Z-axis passes through the center of a stage to be described later in a vertical direction, for example.

The bottom portion 12b is provided at a lower end side of the sidewall 12a. An upper end portion of the sidewall 12a is opened. The opening at the upper end portion of the sidewall 12a is closed by a dielectric window 18. The dielectric window 18 is held between the upper end portion of the sidewall 12a and the ceiling portion 12c. A sealing member SL is interposed between the dielectric window 18 and the upper end portion of the sidewall 12a. The sealing member SL is, e.g., an O-ring, and contributes to sealing of the chamber 12.

In the chamber 12, a stage 20 is provided below the dielectric window 18. The stage 20 includes a lower electrode LE and an electrostatic chuck ESC. The lower electrode LE includes a first plate 22a and a second plate 22b which are made of, e.g., aluminum or the like, and have a substantially disc shape. The second plate 22b is supported by a cylindrical support SP. The support SP extends vertically upward from the bottom portion 12b. The first plate 22a is provided on the second plate 22b and is electrically connected to the second plate 22b.

The lower electrode LE is electrically connected to a high frequency power supply RFG through a power feed rod PFR and a matching unit MU. The high frequency power supply RFG supplies a high frequency bias power to the lower electrode LE. A frequency of the high frequency bias power generated by the high frequency power supply RFG is a predetermined frequency suitable for controlling energy of ions attracted to the wafer W, e.g., 13.56 MHz. The matching unit MU accommodates a matcher for matching an impedance of the high frequency power supply RFG side and an impedance of a load side, mainly the lower electrode LE, the plasma, and the chamber 12. The matcher has therein, e.g., a blocking capacitor for self-bias generation and the like.

The electrostatic chuck ESC is provided on the first plate 22a. The electrostatic chuck ESC has a mounting region MR, for mounting the wafer W, which faces the processing space S. The mounting region MR is a substantially circular region substantially orthogonal to the Z-axis and has a diameter substantially equal to or slightly smaller than that of the wafer W. Further, the mounting region MR constitutes an upper surface of the stage 20, and the center of the mounting region MR, i.e., the center of the stage 20, is positioned on the Z-axis.

The electrostatic chuck ESC holds the wafer W by an electrostatic attraction force. The electrostatic chuck ESC includes an attraction electrode provided in a dielectric member. A DC power supply DCS is connected to the attraction electrode of the electrostatic chuck ESC through a switch SW and a coating wire CL. The wafer W is attracted and held on the upper surface of the electrostatic chuck ESC by a Coulomb force generated by a DC voltage applied from the DC power supply DCS. A focus ring FR annularly surrounding a periphery of the wafer W is provided at a radially outer side of the electrostatic chuck ESC.

An annular flow path 24 is formed inside the first plate 22a. A coolant is supplied to the flow path 24 from a chiller unit (not shown) through a line PP1. The coolant supplied to the flow path 24 is returned to the chiller unit through a line PP3. Further, a heat transfer gas, e.g., He gas or the like, from a heat transfer gas supply unit (not shown) is supplied to a gap between the upper surface of the electrostatic chuck ESC and the backside of the wafer W through a supply line PP2.

A space is formed outside an outer periphery of the stage 20, i.e., between the stage 20 and the sidewall 12a. This space serves as a gas exhaust path VL having an annular shape when seen from the top. An annular baffle plate 26 having a plurality of through-holes is provided between the gas exhaust path VL and the processing space S. The gas exhaust path VL is connected to a gas exhaust line 28 through a gas exhaust port 28h. The gas exhaust line 28 is provided at the bottom portion 12b of the chamber 12. A gas exhaust unit 30 is connected to the gas exhaust line 28. The gas exhaust unit 30 has a vacuum pump such as a pressure controller, a turbo molecular pump, or the like. The gas exhaust unit 30 can decrease a pressure in the processing space S in the chamber 12 to a desired vacuum level. A gas supplied to the wafer W flows along the surface of the wafer W toward the outside of the edge of the wafer W and is exhausted through the outer periphery of the stage 20 and the gas exhaust path VL by the gas exhaust unit 30.

Further, the etching apparatus 10 of the present embodiment includes heaters HT, HS, HC, and HE as temperature control units. The heater HT is provided at the ceiling portion 12c and extends annularly to surround the antenna 14. The heater HS is provided in the sidewall 12a and extends annularly. The heater HC is provided in the first plate 22a or in the electrostatic chuck ESC. The heater HC is provided below a center portion of the mounting region MR, i.e., at a region intersecting with the Z-axis. The heater HE extends annularly to surround the heater HC. The heater HE is provided below an outer peripheral portion of the mounting region MR.

The etching apparatus 10 further includes the antenna 14, a coaxial waveguide 16, a microwave generator 32, a tuner 34, a waveguide 36, and a mode transducer 38. The antenna 14, the coaxial waveguide 16, the microwave generator 32, the tuner 34, the waveguide 36, and the mode transducer 38 constitute a plasma generation unit for exciting the gas supplied into the chamber 12.

The microwave generator 32 generates microwaves having a frequency of, e.g., 2.45 GHz. The microwave generator 32 is connected to an upper portion of the coaxial waveguide 16 through the tuner 34, the waveguide 36, and the mode transducer 38. The coaxial waveguide 16 extends along the Z-axis that is the central axis thereof.

The coaxial waveguide 16 includes an outer conductor 16a and an inner conductor 16b. The outer conductor 16a has a cylindrical shape extending around the Z-axis. A lower end of the outer conductor 16a is electrically connected to an upper portion of a cooling jacket 40 having a conductive surface. The inner conductor 16b has a cylindrical shape extending around the Z-axis and is provided coaxially with the outer conductor 16a inside the outer conductor 16a. A lower end of the inner conductor 16b is connected to a slot plate 44 of the antenna 14.

In the present embodiment, the antenna 14 is an RLSA (Radial Line Slot Antenna). The antenna 14 is disposed in an opening formed at the ceiling portion 12c to face the stage 20. The antenna 14 includes the cooling jacket 40, a dielectric plate 42, a slot plate 44, and a dielectric window 18. The dielectric plate 42 has a substantially disc shape, and shortens the wavelength of the microwave. The dielectric plate 42 is made of, e.g., quartz, alumina or the like, and is held between the upper surface of the slot plate 44 and the lower surface of the cooling jacket 40.

Figure 2:
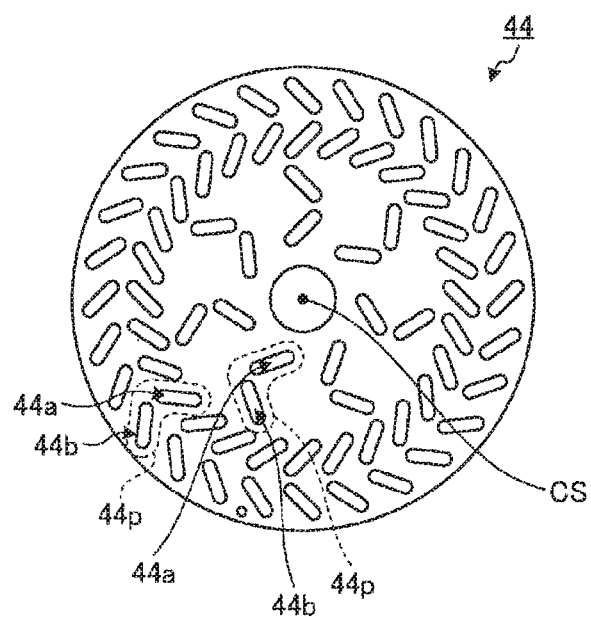
FIG. 2 is a plan view showing an example of a slot plate.

FIG. 2 is a plan view showing an example of the slot plate 44. The slot plate 44 is a thin disc-shaped plate. Opposite surfaces of the slot plate 44 in the plate thickness direction are flat. A center CS of the slot plate 44 is located on the Z-axis. The slot plate 44 is provided with a plurality of slot pairs 44p. Each of the slot pairs 44p includes two slots 44a and 44b penetrating in the plate thickness direction. Each of the slots 44a and 44b has, e.g., an elongated round shape, when seen from the top. In each slot pair 44p, an extension direction of a long axis of the slot 44a and an extension direction of a long axis of the slot 44b intersect with or are orthogonal to each other. The plurality of slot pairs 44p is arranged around the center CS to surround the center CS of the slot plate 44. In the example shown in FIG. 2, the slot pairs 44p are arranged along two concentric circles. On each concentric circle, the slot pairs 44p are arranged at an approximately equal interval. The slot plate 44 is provided on an upper surface of the dielectric window 18.

Referring back to FIG. 1, the microwave generated by the microwave generator 32 propagates to the dielectric plate 42 while passing through the tuner 34, the waveguide 36, the mode transducer 38 and the coaxial waveguide 16, and propagates through the slots 44a and 44b of the slot plate 44 to the dielectric window 18. The energy of the microwave propagated to the dielectric window 18 concentrates on recesses 18a and 18b defined by a portion having a comparatively thin thickness, directly below the dielectric window 18. Therefore, the etching apparatus 10 can generate plasma and distribute the plasma stably in the circumferential direction and in the radial direction of the chamber 12.

The etching apparatus 10 further includes a central gas introducing unit 50 and a peripheral gas introducing unit 52. The central gas introducing unit 50 includes a conduit 50a, an injector 50b, and a gas injection port 18i. The conduit 50a is provided inside the inner conductor 16b of the coaxial waveguide 16. The injector 50b is accommodated in the dielectric window 18 below the end of the conduit 50a. The injector 50b is provided with a plurality of through-holes extending in the Z-axis direction. The dielectric window 18 has the gas injection port 18i extending along the Z-axis. The central gas introducing unit 50 supplies a gas to the injector 50b through the conduit 50a, and injects the gas from the injector 50b into the processing space S through the gas injection port 18i. The central gas introducing unit 50 injects the gas into the processing space S directly below the dielectric window 18 along the Z-axis. In other words, in the processing space S, the central gas introducing unit 50 introduces the gas into a plasma generation region having a high electron temperature. The gas discharged from the central gas introducing unit 50 flows toward the central region of the wafer W substantially along the Z-axis.

A plurality of flow rate control units FC1 to FC4 is connected to the central gas introducing unit 50. Each of the flow rate control units FC1 to FC4 has a flow rate controller and an on-off valve. A gas source GS1 is connected to the flow rate control unit FC1, a gas source GS2 is connected to the flow rate control unit FC2, a gas source GS3 is connected to the flow rate control unit FC3, and a gas source GS4 is connected to the flow rate control unit FC4. In the present embodiment, the gas source GS1 supplies He gas; the gas source GS2 supplies $CH_3F$ gas; the gas source GS3 supplies $N_2$ gas; and the gas source GS4 supplies $H_2$ gas. The $CH_3F$ gas is an example of a first gas. The mixed gas of the $H_2$ gas and the $N_2$ gas is an example of a second gas.

The flow rate control unit FC1 controls a flow rate of the He gas supplied from the gas source GS1 to supply the He gas at a predetermined flow rate into the chamber 12 through the central gas introducing unit 50. The flow rate control unit FC2 controls a flow rate of the $CH_3F$ gas supplied from the gas source GS2 to supply the $CH_3F$ gas at a predetermined flow rate into the chamber 12 through the central gas introducing unit 50. The flow rate control unit FC3 controls a flow rate of the $N_2$ gas supplied from the gas source GS3 to supply the $N_2$ gas at a predetermined flow rate into the chamber 12 through the central gas introducing unit 50. The flow rate control unit FC4 controls a flow rate of the $H_2$ gas supplied from the gas source GS4 to supply the $H_2$ gas at a predetermined flow rate into the chamber 12 through the central gas introducing unit 50.

As shown in FIG. 1, for example, the peripheral gas introducing unit 52 is provided between the gas injection port 18*i* of the dielectric window 18 and the upper surface of the stage 20 in the height direction, i.e., in the Z-axis direction. The peripheral gas introducing unit 52 introduces a gas into the processing space S from a position along the sidewall 12*a*. The peripheral gas introducing unit 52 includes an annular pipe 52*p* made of, e.g., quartz or the like. A plurality of gas injection ports 52*i* is formed in the pipe 52*p*. Each of the gas injection ports 52*i* injects the gas obliquely upward toward the Z-axis direction. Flow rate control units FC5 and FC6 are connected to the pipe 52*p* of the peripheral gas introducing unit 52 through a gas supply block 56. Each of the flow rate control units FC5 and FC6 includes a flow rate controller and an on-off valve. A gas source GS5 is connected to the flow rate control unit FC5, and a gas source GS6 is connected to the flow rate control unit FC6. In the present embodiment, the gas source GS5 supplies He gas and the gas source GS6 supplies $N_2$ gas.

The flow rate control unit FC5 controls a flow rate of the He gas supplied from the gas source GS5 to supply the He gas at a predetermined flow rate into the chamber 12 through the gas supply block 56 and the peripheral gas introducing unit 52. The flow rate control unit FC6 controls a flow rate of the $N_2$ gas supplied from the gas source GS6 to supply the $N_2$ gas at a predetermined flow rate into the chamber 12 through the gas supply block 56 and the peripheral gas introducing unit 52. The flow rate control units FC1, FC2, and FC5 and the gas sources GS1, GS2, and GS5 are examples of a first supply unit. The flow rate control units FC3, FC4, and FC6 and the gas sources GS3, GS4, and GS6 are examples of a second supply unit.

The etching apparatus 10 can independently control a type and a flow rate of a gas supplied into the processing space S from the central gas introducing unit 50 and a type and a flow rate of a gas supplied into the processing space S from the peripheral gas introducing unit 52.

As shown in FIG. 1, for example, the etching apparatus 10 includes a control unit Cnt including a processor, a memory, and the like. The control unit Cnt controls the respective components of the etching apparatus 10 in accordance with a program and data such as a recipe or the like stored in the memory. For example, the control unit Cnt controls the flow rate controllers and the on-off valves in the flow rate control units FC1 to FC6 and adjusts the flow rates of the gases introduced from the central gas introducing unit 50 and the peripheral gas introducing unit 52. Further, the control unit Cnt controls the microwave generator 32 to control the frequency and the power of the microwave generated by the microwave generator 32. Moreover, the control unit Cnt controls the high frequency power supply RFG to control the frequency and the power of the high frequency bias power generated by the high frequency power supply RFG and the supply of the high frequency bias power and stop of the supply. Furthermore, the control unit Cnt controls the pressure controller and the vacuum pump in the gas exhaust unit 30 to control the pressure in the chamber 12. Further, the control unit Cnt controls the heaters HT, HS, HC and HE to adjust temperatures of the respective components in the chamber 12.

(Structure of Wafer W)

Figure 3:
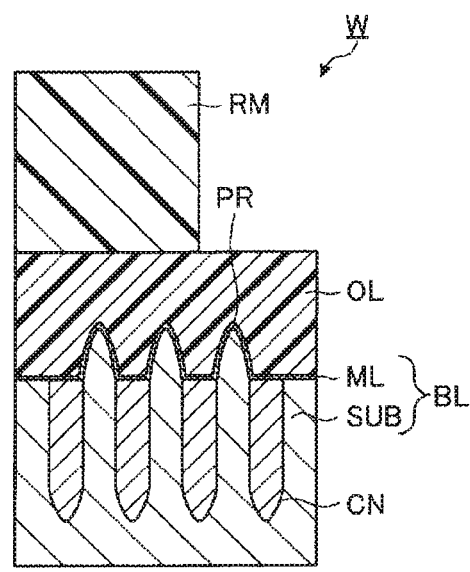
FIG. 3 is a cross sectional view showing an example of a wafer W.

FIG. 3 is a cross sectional view showing an example of the wafer W. As shown in FIG. 3, for example, the wafer W in the present embodiment includes a base film BL, an organic film OL, and a resist mask RM. The base film BL forms a base of the organic film OL. The base film BL includes a metal film ML and a silicon substrate SUB. The metal film ML is formed at an upper layer of the base film BL and is in contact with the organic film OL. The metal film ML is made of, e.g., titanium nitride (TiN) or the like. The organic film OL is, e.g., BARC (Bottom Anti Reflective Coating). The organic film OL is an example of a first organic film. The resist mask RM is an example of a mask film and a second organic film.

The resist mask RM is made of an organic material and is provided on the organic film OL. The resist mask RM has a predetermined pattern partially covering the organic film OL. The resist mask RM having a predetermined pattern is formed on the organic film OL by, e.g., a photolithography technique. The organic film OL is etched so that the pattern of the resist mask RM is transferred to the organic film OL.

In the present embodiment, as shown in FIG. 3, for example, a plurality of protrusions PR and a plurality of recesses CN are formed in the silicon substrate SUB. The protrusions PR are formed on the silicon substrate SUB to be separated from each other. The recesses CN are formed in the silicon substrate SUB to be separated from each other. Silicon oxide, for example, is buried in each of the recesses CN. As shown in FIG. 3, for example, the protrusions PR are formed in the silicon substrate SUB of the present embodiment, and, thus, a thickness of the organic film OL on the protrusions PR is thinner than that of the organic film OL on the other portions.

(Processing Flow)

Figure 4:
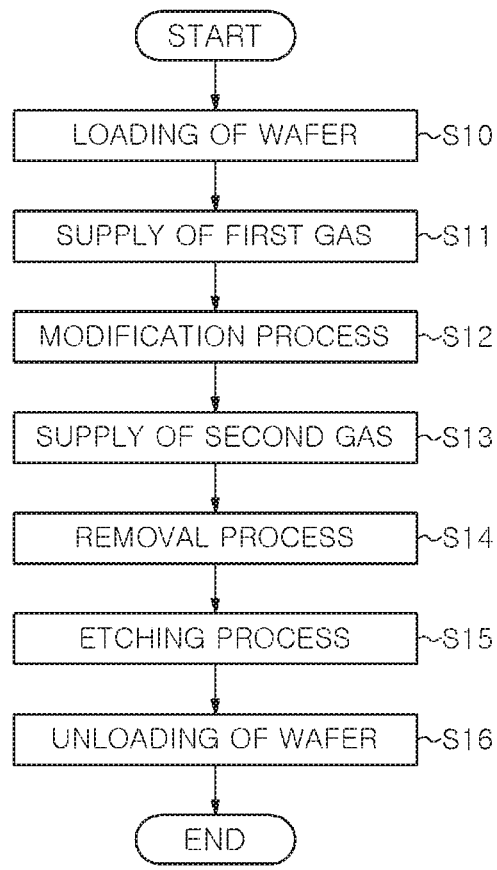
FIG. 4 is a flowchart showing an example of an etching process.

The etching apparatus 10 configured as described above performs the processing shown in FIG. 4, for example. FIG. 4 is a flowchart showing an example of the etching process.

Figure 5:
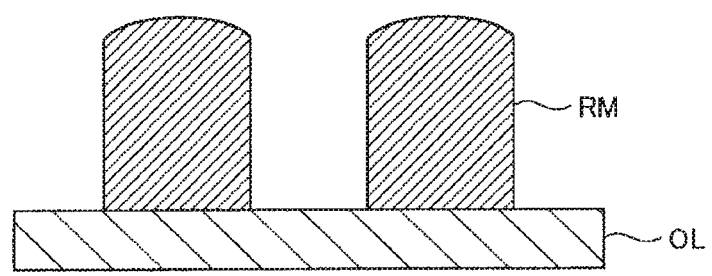
FIG. 5 schematically shows examples of a resist mask and an organic film in an initial state.

First, the wafer W shown in FIG. 3, for example, is loaded into the chamber 12 and mounted on the electrostatic chuck ESC (S10). In the initial state, the resist mask RM and the organic film OL are in a state shown in FIG. 5, for example. FIG. 5 schematically shows examples of the resist mask RM and the organic film OL in the initial state. As shown in FIG. 5, for example, a part of the surface of the organic film OL is covered with the resist mask RM formed in a predetermined pattern.

Then, the control unit Cnt controls the switch SW to apply a DC voltage from the DC power supply DCS to the electrostatic chuck ESC. Accordingly, the wafer W is attracted and held on the upper surface of the electrostatic chuck ESC. Then, the control unit Cnt controls the pressure controller and the vacuum pump in the gas exhaust unit 30 to decrease the pressure in the chamber 12 to a predetermined vacuum level. Further, the control unit Cnt controls the heaters HT, HS, HC and HE to adjust the temperatures of the respective components in the chamber 12 to predetermined levels.

Then, the control unit Cnt supplies the first gas into the chamber 12 (S11). Specifically, the control unit Cnt controls the flow rate controller and the on-off valve in the flow rate control unit FC2 to supply the $CH_3F$ gas supplied from the gas source GS2 at a predetermined flow rate from the central gas introducing unit 50 into the processing space S. Further, the control unit Cnt controls the flow rate controller and the on-off valve in the flow rate control unit FC1 to supply the He gas supplied from the gas source GS1 at a predetermined flow rate from the central gas introducing unit 50 into the processing space S. Moreover, the control unit Cnt controls the flow rate controller and the on-off valve in the flow rate control unit FC5 to supply the He gas supplied from the gas source GS5 at a predetermined flow rate from the peripheral gas introducing unit 52 into the processing space S. Then, the control unit Cnt controls the pressure controller in the gas exhaust unit 30 to control the pressure in the chamber 12 to a predetermined level. The step S11 is an example of a first supply step.

Next, the control unit Cnt performs a modification process of modifying the surface of the wafer W by plasma of the first gas supplied into the chamber 12 (S12). Specifically, the control unit Cnt controls the microwave generator 32 to supply a microwave of, e.g., 2.45 GHz, to the processing space S at a predetermined power. Accordingly, plasma of the first gas is generated in the processing space S, and the surface of the wafer W is modified by the plasma of the first gas. Specifically, a modified layer is formed on the upper surface and the side surface of the resist mask RM and on the surface of the organic film OL which is not covered with the resist mask RM. In the step S12, the control unit Cnt stops the application of the high frequency bias power to the stage 20 by stopping the high frequency power supply RFG. The step S12 is an example of a modification step.

Figure 6:
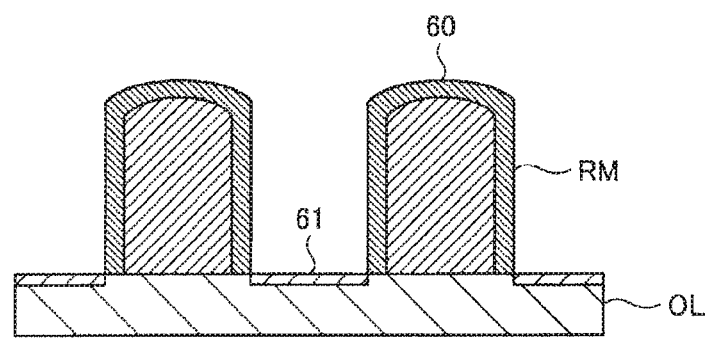
FIG. 6 schematically shows examples of the resist mask and the organic film after a modification process.

The modification process in the step S12 is performed under the following conditions.
Pressure: 80 mT
Microwave power: 2000 W
High frequency bias power: 0 W
Processing time: 10 seconds
$CH_3F$ gas supplied from the central gas introducing unit 50: 40 sccm
He gas supplied from the central gas introducing unit 50: 175 sccm
He gas supplied from the peripheral gas introducing unit 52: 175 sccm The state of the resist mask RM and the organic film OL after the modification process is shown in FIG. 6, for example. FIG. 6 schematically shows examples of the resist mask RM and the organic film OL after the modification process. When the modification process is performed, a modified layer 60 is formed on the upper surface and the side surface of the resist mask RM, and a modified layer 61 is formed on the surface of the organic film OL which is not covered with the resist mask RM Next, a second gas is supplied into the chamber 12 (S13). Specifically, the control unit Cnt controls the on-off valves in the flow rate control units FC1, FC2, and FC5 to stop the supply of the He gas and the $CH_3F$ gas. Then, the control unit Cnt controls the vacuum pump in the gas exhaust unit 30 to exhaust the gas in the chamber 12. Further, the control unit Cnt controls the flow rate controller and the on-off valve in the flow rate control unit FC3 to supply the $N_2$ gas from the gas source GS3 at a predetermined flow rate from the central gas introducing unit 50 into the processing space S. Moreover, the control unit Cnt controls the flow rate controller and the on-off valve in the flow rate control unit FC6 to supply the $N_2$ gas from the gas source GS6 at a predetermined flow rate from the peripheral gas introducing unit 52 into the processing space S. Furthermore, the control unit Cnt controls the flow rate controller and the on-off valve in the flow rate control unit FC4 to supply the $H_2$ gas from the gas source GS4 at a predetermined flow rate from the central gas introducing unit 50 into the processing space S. Then, the control unit Cnt controls the pressure controller in the gas exhaust unit 30 to control the pressure in the chamber 12 to a predetermined level. The step S13 is an example of a second supply step.

Next, the control unit Cnt performs a removal process of removing the modified layer formed on the surface of the organic film OL which is not covered with the resist mask RM and the modified layer formed on the upper surface of the resist mask RM by the plasma of the second gas supplied into the chamber 12 (S14). Specifically, the control unit Cnt controls the microwave generator 32 to supply a microwave of, e.g., 2.45 GHz, into the processing space S at a predetermined power. Accordingly, plasma of the second gas is generated in the processing space S. Further, the control unit Cnt controls the high frequency power supply RFG to apply a high frequency bias power to the stage 20 at a predetermined power. Accordingly, ions in the plasma of the second gas are attracted into the wafer W, and the surface of the wafer W is etched by the ions. As a result, the modified layer formed on the surface of the resist mask RM and on the surface of the organic film OL which is not covered with the resist mask RM is removed. In the present embodiment, the modification process in the step S14 is performed for, e.g., 10 seconds or more. The step S14 is an example of a removal step.

The removal process in the step S14 is performed under the following conditions.
Pressure: 80 mT
Microwave power: 1000 W
High frequency bias power: 150 W
Processing time: 40 seconds
$N_2$ gas supplied from the central gas introducing unit 50: 100 sccm
$N_2$ gas supplied from the peripheral gas introducing unit 52: 100 sccm
$H_2$ gas supplied from the central gas introducing unit 50: 124 sccm Next, the control unit Cnt performs an etching process of etching the organic film OL by the plasma of the second gas supplied into the chamber 12 while using the resist mask RM as a mask (S15). Specifically, the control unit Cnt controls the microwave generator 32 to supply a microwave of, e.g., 2.45 GHz, into the processing space S at a predetermined power. Accordingly, plasma of the second gas is generated in the processing space S. Further, the control unit Cnt controls the high frequency power supply RFG to apply a high frequency bias power to the stage 20 at a predetermined power. Accordingly, ions in the plasma of the second gas are attracted into the wafer W, and the organic film OL is etched by the ions while using the resist mask RM as a mask. The step S15 is an example of an etching step.

The etching process in the step S15 is performed under the following conditions.
Pressure: 80 mT
Microwave power: 80 W
High frequency bias power: 1000 W
$N_2$ gas supplied from the central gas introducing unit 50: 100 sccm
$N_2$ gas supplied from the peripheral gas introducing unit 52: 100 sccm
$H_2$ gas supplied from the central gas introducing unit 50: 124 sccm Next, the control unit Cnt controls the on-off valves in the flow rate control units FC3, FC4, and FC6 to stop the supply of the $N_2$ gas and the $H_2$ gas. Then, the control unit Cnt controls the vacuum pump in the gas exhaust unit 30 to exhaust the gas in the chamber 12. Then, the control unit Cnt controls the switch SW to cut off the application of the DC voltage from the DC power supply DCS to the electrostatic chuck ESC. Then, the wafer W is unloaded from the stage 20 (S16).

Figure 7:
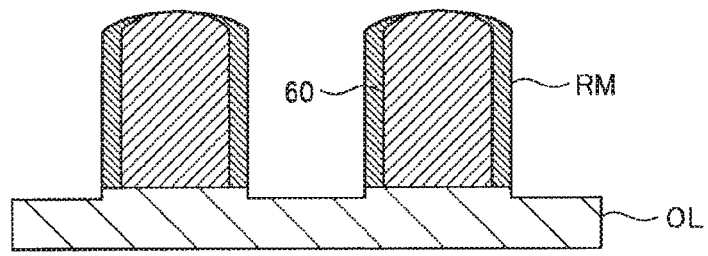
FIG. 7 schematically shows examples of the resist mask and the organic film after a removal process.

The state of the resist mask RM and the organic film OL after the removal process is shown in FIG. 7, for example. FIG. 7 schematically shows examples of the resist mask RM and the organic film OL after the removal process. When the removal process is performed, the modified layer 60 formed on the upper surface of the resist mask RM is removed and the modified layer 60 formed on the side surface of the resist mask RM remains, as shown in FIG. 7, for example.

Due to the modified layer 60 remaining at the side surface of the resist mask RM, the etching in the horizontal direction of the resist mask RM is suppressed in the etching process of etching the organic film OL while using the resist mask RM as a mask. Accordingly, the dimensional variation of the resist mask RM during the etching is suppressed, which makes is possible to suppress an increase in the CD of the groove formed in the organic film OL by the etching.

The modified layer 61 formed on the surface of the organic film OL which is not covered with the resist mask RM is removed by the removal process as shown in FIG. 7, for example. Therefore, when the organic film OL is etched while using the resist mask RM as a mask, the etching of the organic film OL in the vertical direction is not hindered by the modified layer 61. Accordingly, the etching rate of the organic film OL can be increased.

By removing the modified layer 61 by the removal process, the etching of the organic film OL proceeds without excessively increasing the high frequency bias power. If the high frequency bias power is excessively increased, the selectivity between the organic film OL and the metal film ML below the organic film OL is decreased. If the selectivity between the organic film OL and the metal film ML is decreased, in the case of etching the organic film OL that is formed on the metal film ML and that has a non-uniform thickness as shown in FIG. 3, for example, damages inflicted on the metal film ML positioned below the thin organic film OL are increased until the etching of the thick organic film OL is terminated.

On the other hand, in the present embodiment, by removing the modified layer 61 by the removing process, the etching of the organic film OL proceeds without excessively increasing the high frequency bias power. Therefore, the selectivity between the organic film OL and the metal film ML can be maintained at a high level. Accordingly, even in the case of etching the organic film OL having a non-uniform thickness as shown in FIG. 3, for example, it is possible to suppress damages inflicted on the metal film ML positioned below the organic film OL.

A test of etching the organic film OL after the removal of the modified layer 61 while varying the high frequency bias power was conducted. As a result, when the high frequency bias power was set to 150 W, damages inflicted on the metal film below the organic film OL were increased, and the surface of the metal film ML became rough. On the other hand, when the high frequency bias power was set to 70 W, damages inflicted on the surface of the metal film ML were reduced and the surface of the metal film ML became smooth. In view of the test result, it is preferable to set the high frequency bias power to 70 W or less in the case of etching the organic film OL after the removal of the modified layer 61.

(Composition of Modified Layer)

Figure 8:
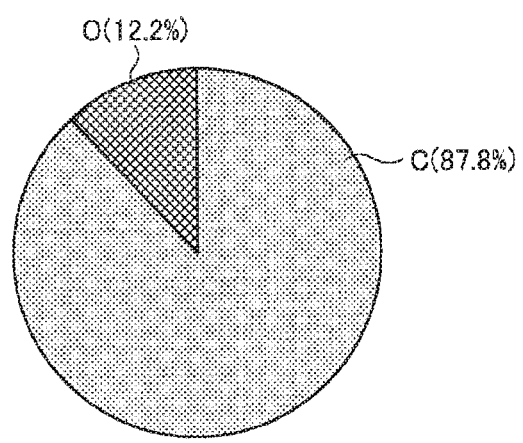
FIG. 8 shows an example of a composition ratio of the resist mask in the initial state.

A composition ratio of the resist mask RM in the initial state shown in FIG. 5 is shown in FIG. 8, for example. FIG. 8 shows an example of the composition ratio of the resist mask RM in the initial state. As shown in FIG. 8, for example, the resist mask RM in the initial state contains 87.8% of carbon and 12.2% of oxygen.

Figure 9:
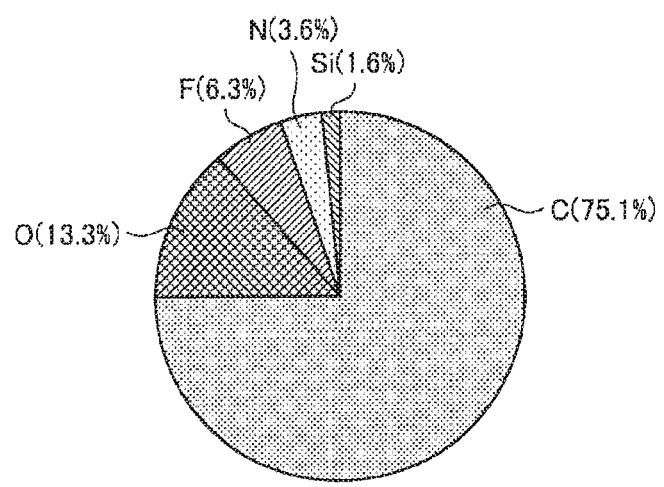
FIG. 9 shows an example of a composition ratio of the resist mask after the modification process.

The composition ratio of the resist mask RM after the modification process shown in FIG. 6 is shown in FIG. 9, for example. FIG. 9 shows an example of the composition ratio of the resist mask RM after the modification process. As shown in FIG. 9, for example, the resist mask RM after the modification process contains 6.3% of fluorine, 6% of nitrogen, and 1.6% of silicon, in addition to 75.1% of carbon and 13.3% of oxygen. In the resist mask RM after the modification process, the content ratios of fluorine, nitrogen and silicon were increased and that of carbon was decreased, compared to the resist mask RM in the initial state.

Figure 10:
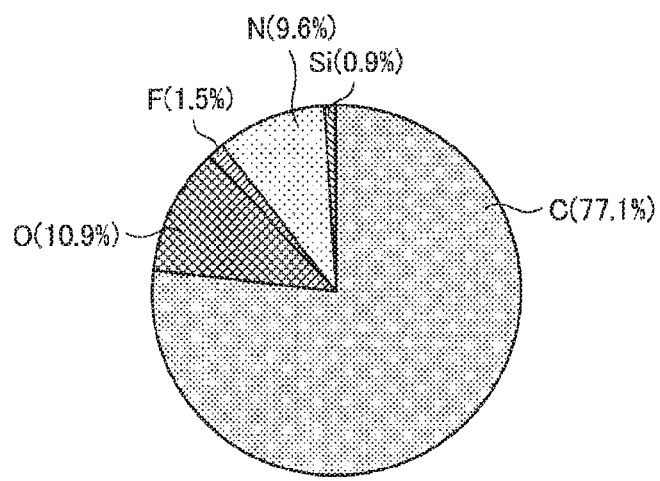
FIG. 10 shows an example of a composition ratio of the resist mask after the removal process.

The composition ratio of the resist mask RM after the removal process shown in FIG. 7 is shown in FIG. 10, for example. FIG. 10 shows an example of the composition ratio of the resist mask RM after the removal process. As shown in FIG. 10, for example, the resist mask RM after the removal process contains 1.5% of fluorine, 9.6% of nitrogen, and 0.9% of silicon, in addition to 77.1% of carbon and 10.9% of oxygen. In the resist mask RM after the removal process, the content ratio of nitrogen was increased, and those of oxygen, fluorine, and silicon were decreased, compared to the resist mask RM after the modification treatment.

Figure 11:
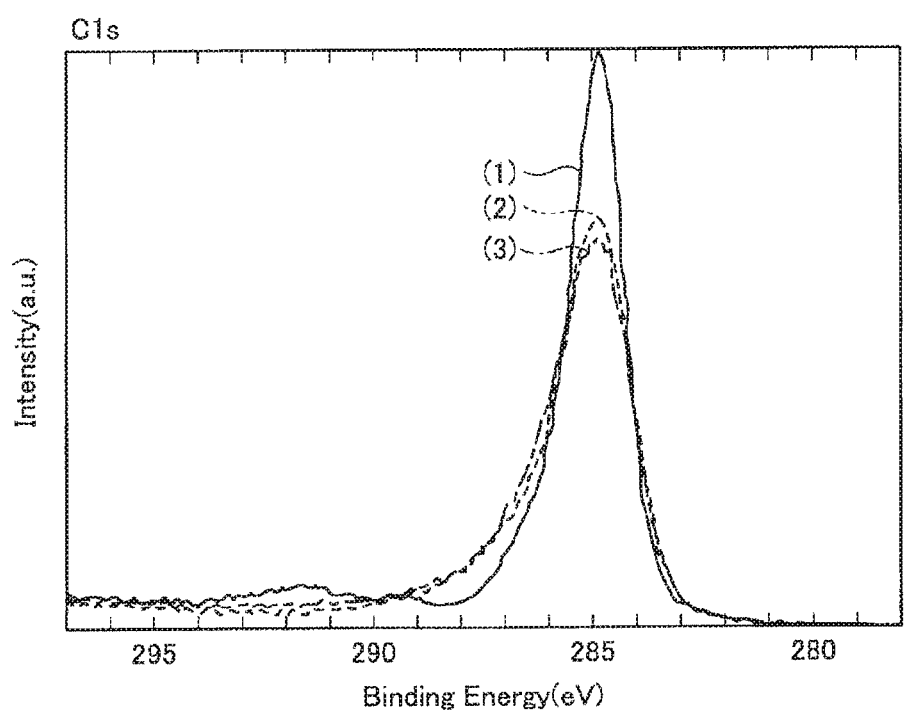
FIG. 11 shows an example of an XPS (X-ray Photoelectron Spectroscopy) spectrum showing binding energy of carbon.
Figure 12:
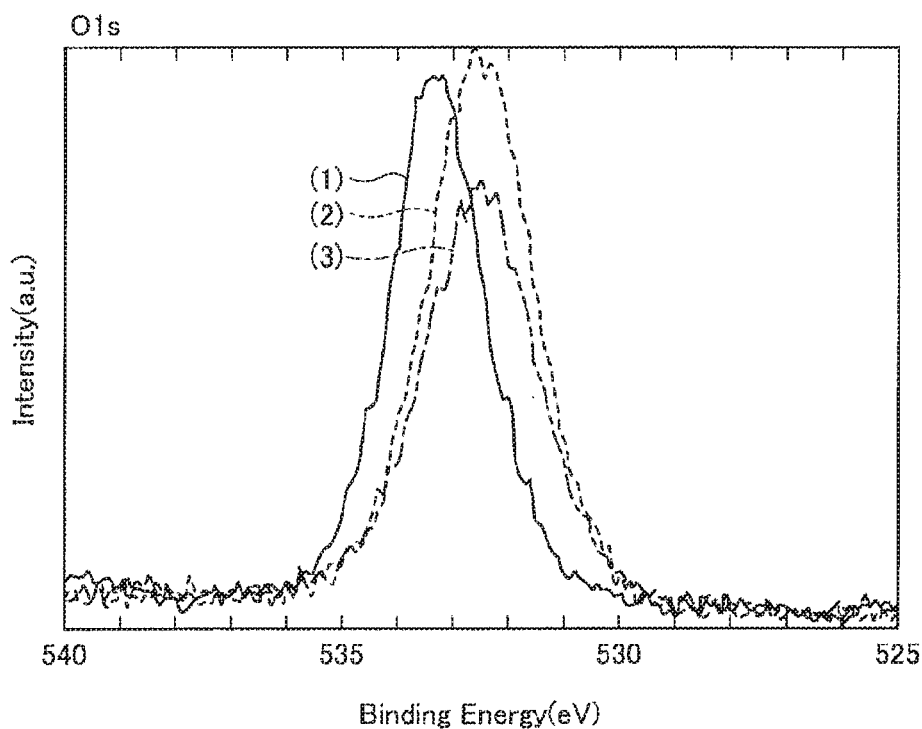
FIG. 12 shows an example of an XPS spectrum showing binding energy of oxygen.
Figure 13:
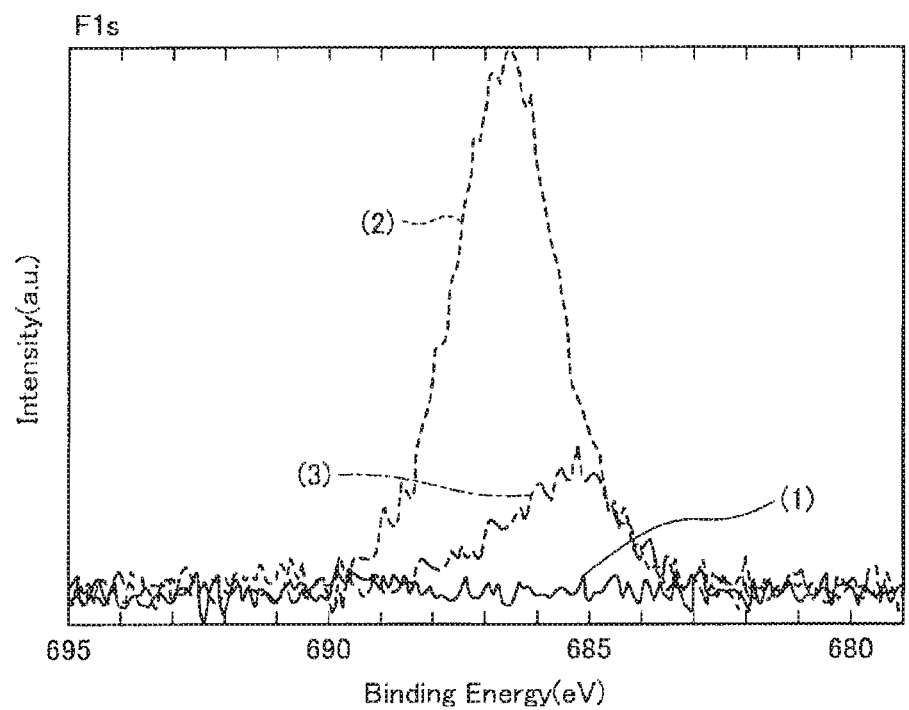
FIG. 13 shows an example of an XPS spectrum showing binding energy of fluorine.
Figure 14:
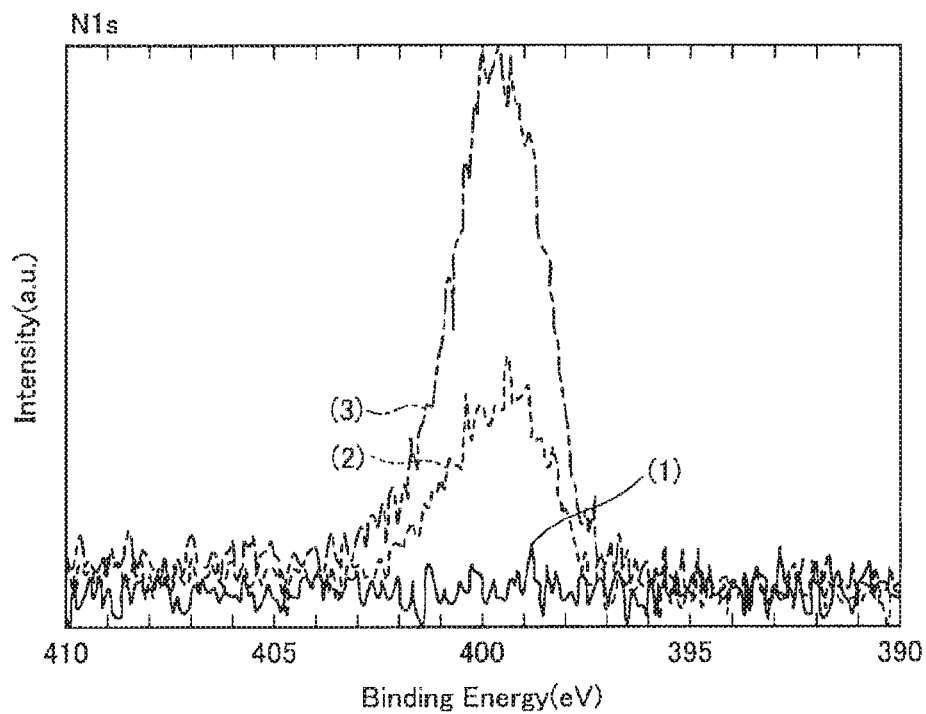
FIG. 14 shows an example of an XPS spectrum showing binding energy of nitrogen.
Figure 15:
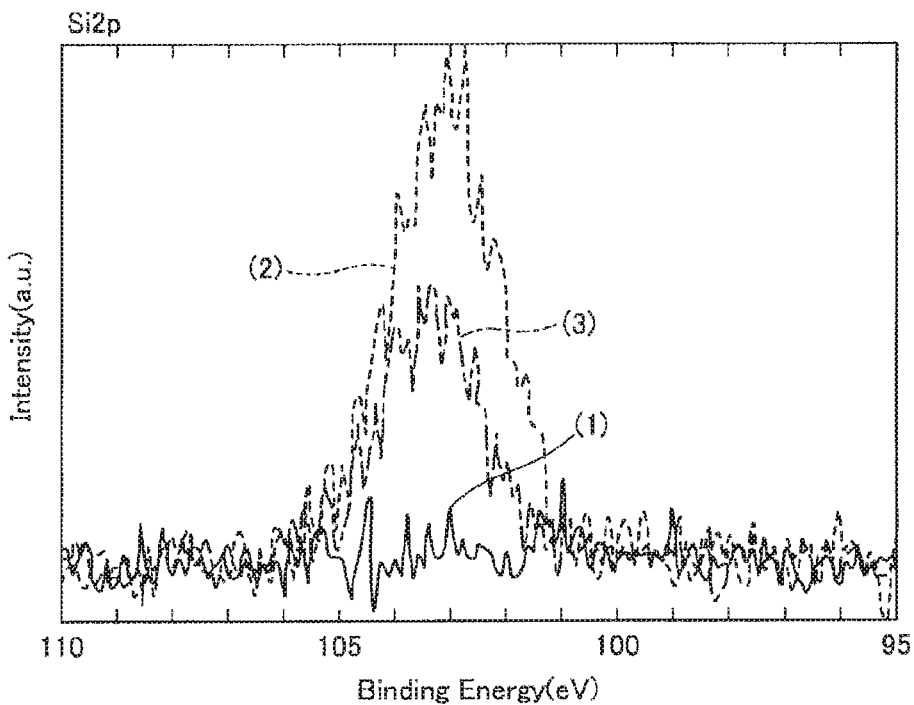
FIG. 15 shows an example of an XPS spectrum showing binding energy of silicon.

FIG. 11 shows an example of an XPS spectrum showing binding energy of carbon. FIG. 12 shows an example of the XPS spectrum showing binding energy of oxygen. FIG. 13 shows an example of the XPS spectrum showing binding energy of fluorine. FIG. 14 shows an example of the XPS spectrum showing binding energy of nitrogen. FIG. 15 shows an example of the XPS spectrum showing binding energy of silicon. In FIGS. 11 to 15, (1) shows an example of the XPS spectrum of the binding energy of each element contained in the resist mask RM in the initial state; (2) shows an example of the XPS spectrum of the binding energy of each element contained in the resist mask RM after the modification process; and (3) shows an example of the XPS spectrum of the binding energy of each element contained in the resist mask RM after the removal process.

As shown in FIG. 11, for example, in the resist mask RM after the modification process, the emission intensity of the binding energy near 285 eV corresponding to C—C bond, C—H bond and benzene ring bond was decreased, compared to that in the initial state. Further, as shown in FIG. 11, for example, in the resist mask RM after the modification process, the emission intensity of the binding energy near 292 eV corresponding to $\pi$ bond of the benzene ring was decreased, compared to that in the initial state. From these results, it is considered that some of the benzene rings were removed or $\pi$ bonds of some of the benzene rings were destroyed on the surface of the resist mask RM by the modification process.

As shown in FIG. 13, for example, in the resist mask RM after the modification process, the emission intensity of the binding energy near 686 eV corresponding to C—F bond was increased, compared to that in the initial state. From this result, it is considered that the C—F bond was increased on the surface of the resist mask RM by the modification process.

As shown in FIG. 14, for example, in the resist mask RM of the modification process, the emission intensity of the binding energy near 400 eV corresponding to C—N bond, C=N bond or N—H bond was increased, compared to that in the initial state. From this result, it is considered that nitriding has occurred on the surface of the resist mask RM by the modification process.

As shown in FIG. 15, for example, in the resist mask RM after the modification process, the emission intensity of the binding energy near 103 eV corresponding to $SiO_2$ bond was increased, compared to that in the initial state. From this result, it is considered that $SiO_2$ was adhered to the surface of the resist mask RM by the modification process.

Figure 16:
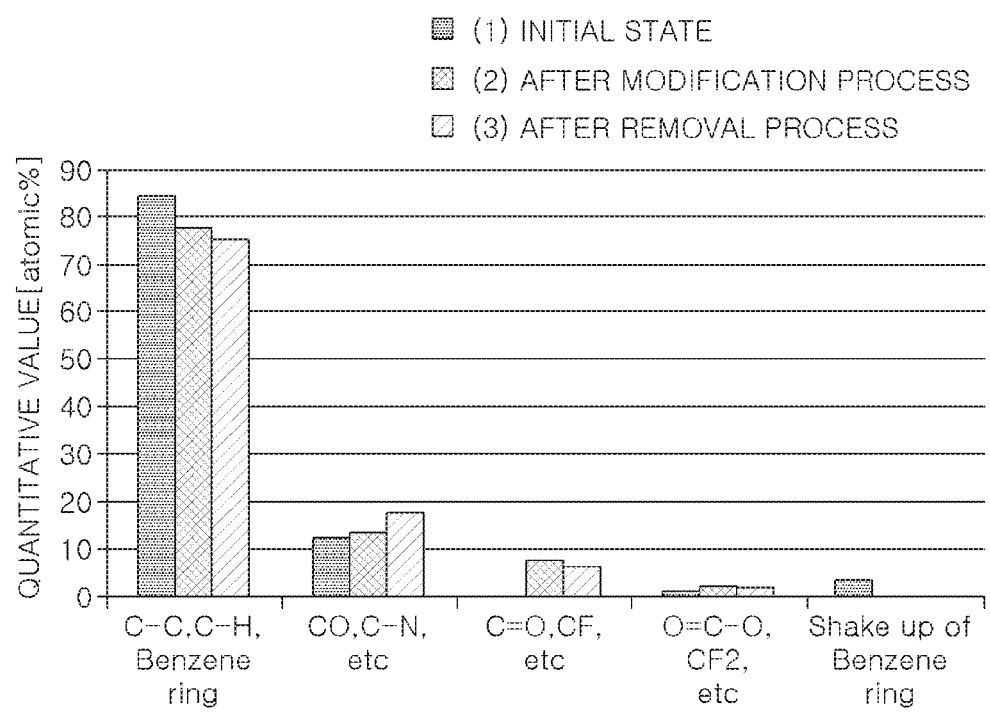
FIG. 16 shows examples of quantitative values of bonding states.

The above results are summarized in FIG. 16, for example. FIG. 16 shows examples of quantitative values of the respective bonding state. As shown in FIG. 16, for example, in the modified layer 60 formed on the surface of the resist mask RM, some of the benzene ring bonds are removed and π bonds of some of the benzene ring bonds are destroyed, and C—F bonds are increased by performing the modification process. Further, by performing the modification process, nitriding occurs in the modified layer 60 formed on the surface of the resist mask RM, and $SiO_2$ is adhered to the surface of the resist mask RM. It is considered that the modified layer 61 having the same composition is formed on the surface of the organic film OL which is not covered with the resist mask RM by performing the modification process. Accordingly, it is considered that the plasma resistance of the modified layer 60 is higher than that of the resist mask RM in the initial state.

(Etching of Modified Layer)

Figure 17:
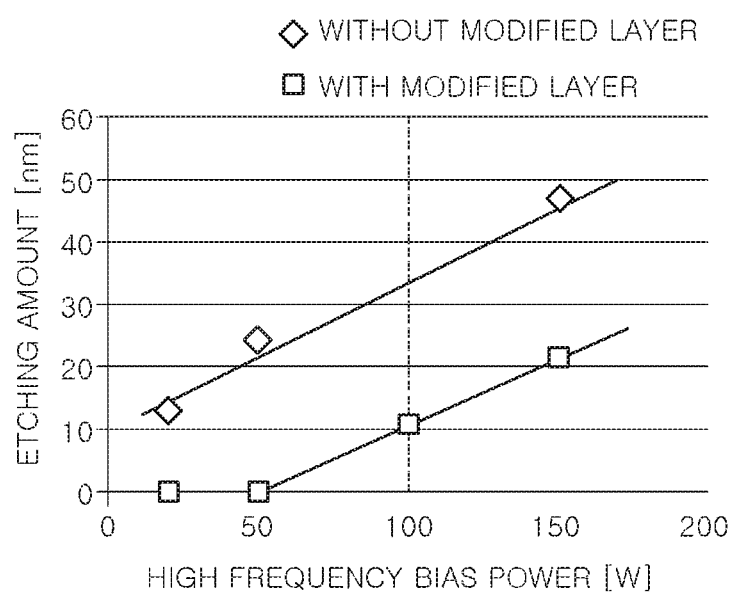
FIG. 17 shows an example of relation between a high frequency bias power and an etching amount.

Here, an etching amount of the modified layer formed on the organic film OL by the modification process was tested. FIG. 17 shows an example of relation between the high frequency bias power and the etching amount. As shown in FIG. 17, for example, the organic film OL having no modified layer can be etched even when the high frequency bias power is 50 W or less. However, the etching of the organic film OL having the modified layer stops when the high frequency bias power is 50 W or less. Further, in this test, the organic film OL having the modified layer can be etched when the high frequency bias power is 100 W or above. From the tendency shown in FIG. 17, it is considered that the organic film OL having the modified layer can be etched as long as the high frequency bias power is 50 W or above.

The test shown in FIG. 17 was conducted under the following conditions.

Figure 18:
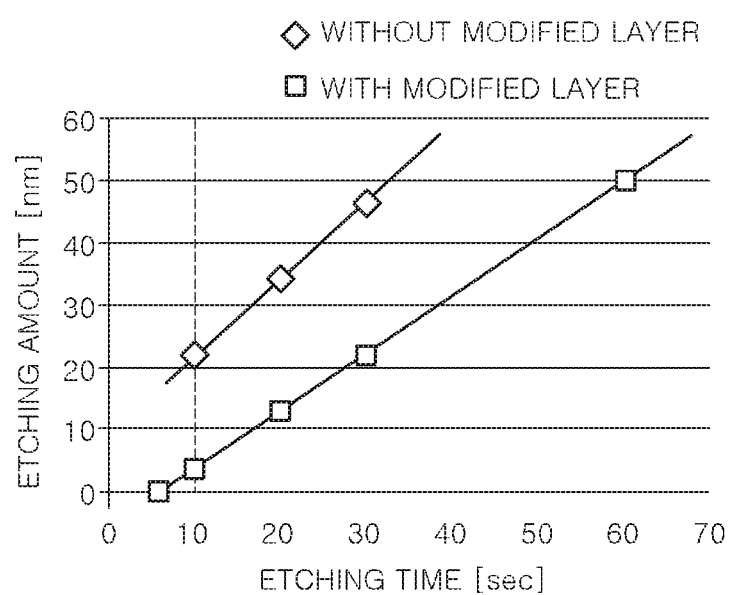
FIG. 18 shows an example of relation between etching time and an etching amount.

Pressure: 80 mT
Microwave power in modification process: 2000 W
Duration of modification process: 10 seconds
$CH_3F$ gas supplied from the central gas introducing unit 50 in modification process: 40 sccm
He gas supplied from the central gas introducing unit 50 in modification process: 175 sccm
He gas supplied from the peripheral gas introducing unit 50 in modification process: 175 sccm
Microwave power in etching process: 1000 W
Duration of etching process: 30 seconds
$N_2$ gas supplied from the central gas introducing unit 50 in etching process: 100 sccm
$N_2$ gas supplied from the peripheral gas introducing unit 52 in etching process: 100 sccm
$H_2$ gas supplied from the central gas introducing unit 50 in etching process: 124 sccm Duration of the etching process of the modified layer formed on the organic film OL by the modification process was also tested. FIG. 18 shows an example of relation between the etching time and the etching amount. As shown in FIG. 18, for example, the organic film OL having no modified layer can be etched even when the duration of the etching process is 10 seconds or less. However, the organic film OL having the modified layer is not etched when the duration of the etching process is 5 seconds or less. Further, in the test, the organic film OL having the modified layer can be etched when the duration of the etching process is 10 seconds or more. From the tendency shown in FIG. 18, it is considered that the organic film OL having the modified layer can be etched when the duration of the etching process exceeds 5 seconds.

The test shown in FIG. 18 was conducted under the following conditions.

Pressure: 80 mT
Microwave power in modification process: 2000 W
High frequency power in modification process: 0 W
Duration of modification process: 10 seconds
$CH_3F$ gas supplied from the central gas introducing unit 50 in modification process: 40 sccm
He gas supplied from the central gas introducing unit 50 in modification process: 175 sccm
He gas supplied from the peripheral gas introducing unit 52 in modification process: 175 sccm
Microwave power in etching process: 1000 W
High frequency bias power in etching process: 150 W
$N_2$ gas supplied from the central gas introducing unit 50 in etching process: 100 sccm
$N_2$ gas supplied from the peripheral gas introducing unit 52 in etching process: 100 sccm
$H_2$ gas supplied from the central gas introducing unit 50 in etching process: 124 sccm In the test result shown in FIG. 18, the organic film OL having the modified layer can be etched by setting the duration of the etching process to be more than 5 seconds because the duration of the modification process is 10 seconds. However, when the duration of the modification process exceeds 10 seconds, the duration of the etching process needs to be further increased.

As clear from the description of the embodiment of the etching apparatus 10, in accordance with the etching apparatus 10 of the present embodiment, an increase in CD of the groove formed in the wafer W by etching can be suppressed by suppressing dimensional deviation of the resist mask RM during the etching.

(Other Applications)

The present disclosure is not limited to the above-described embodiment, and various modifications can be made within the scope of the gist of the present disclosure.

For example, in the above-described embodiment, $CH_3F$ gas is used as the first gas in the modification process. However, the first gas may be any hydrofluorocarbon gas and may be $CH_2F_2$ other than $CH_3F$ gas or a mixed gas of $CH_3F$ and $CH_2F_2$. The hydrofluorocarbon gas used as the first gas is represented by a chemical formula $C_xH_yF_z$ (x, y, and z being natural numbers), and the valence y is preferably greater than the valence z. In the above-described embodiment, the first gas is diluted with He gas in the modification process. However, the dilution gas is not limited to He gas, and may be a rare gas, $N_2$ gas, or the like.

In the above-described embodiment, a mixed gas of $N_2$ gas and $H_2$ gas is used as the second gas in the removal process and the etching process. However, the second gas may be another gas as long as it contains nitrogen and hydrogen.

In the above-described embodiment, a microwave plasma etching apparatus using RLSA has been described as an example of the etching apparatus 10. However, the present disclosure is not limited thereto, and may also be applied to another plasma etching apparatus using a CCP (Capacitively Coupled Plasma), an ICP (Inductively Coupled Plasma) or the like, as long as etching can be performed by using plasma.

While the present disclosure has been shown and described with respect to the embodiments, it will be understood by those skilled in the art that various changes and modifications may be made without departing from the scope of the present disclosure as defined in the following claims.

What is claimed is:

1. An etching method comprising:
   a loading step of loading a target object including a base film, a first organic film and a mask film that are laminated into a chamber and mounting the target object on a stage in the chamber;
   a first supply step of supplying a first gas containing carbon, hydrogen and fluorine into the chamber;
   a modification step of generating plasma of the first gas in the chamber and modifying a surface of the mask film and a surface of the first organic film which is not covered with the mask film;
   a second supply step of supplying a second gas for etching the first organic film into the chamber;
   a removal step of removing a modified layer formed on the surface of the first organic film which is not covered with the mask film by applying a first high frequency bias power to the stage and generating plasma of the second gas in the chamber; and
   an etching step of etching the first organic film below the removed modified layer by applying a second high frequency bias power lower than the first high frequency bias power to the stage and generating plasma of the second gas in the chamber.

2. The etching method of claim 1, wherein the mask film is a second organic film.

3. The etching method of claim 1, wherein the first high frequency bias power applied to the stage in the removal step is 100 W or above, and
   wherein the first high frequency bias power applied to the stage is for an ion attraction and a power for plasma generation is applied to the chamber.

4. The etching method of claim 1, wherein the base film includes a metal film in contact with the first organic film.

5. The etching method of claim 1, wherein the plasma generated in the modification step, the plasma generated in the removal step and the plasma generated in the etching step are generated by a microwave radiated into the chamber through an RLSA (Radial Line Slot Antenna).

6. The etching method of claim 1, wherein an application of the first high frequency bias power to the stage is stopped during the modification step.

7. The etching method of claim 1, wherein the second gas contains nitrogen and hydrogen.

8. The etching method of claim 7, wherein the second gas is a mixed gas of $N_2$ gas and $H_2$ gas.

9. The etching method of claim 1, wherein the first gas contains a hydrofluorocarbon gas.

10. The etching method of claim 9, wherein the hydrofluorocarbon gas is represented by a chemical formula $C_xH_yF_z$ (x, y and z being natural numbers), the valence y being greater than the valence z.

11. The etching method of claim 10, wherein the hydrofluorocarbon gas contains at least one of $CH_3F$ and $CH_2F_2$.

12. An etching apparatus comprising:
    a chamber;
    a stage, provided in the chamber, configured to mount thereon a target object including a base film, a first organic film and a mask film that are laminated;
    a first supply unit configured to supply a first gas containing carbon, hydrogen and fluorine into the chamber;
    a second supply unit configured to supply a second gas for etching the first organic film into the chamber;
    a plasma generation unit configured to generate plasma of the first gas or the second gas in the chamber; and
    a control unit configured to control the first supply unit, the second supply unit and the plasma generation unit,
    wherein the control unit executes:
    a first supply step of supplying the first gas into the chamber in a state where the target object is mounted on the stage;
    a modification step of generating plasma of the first gas in the chamber and modifying a surface of the mask film and a surface of the first organic film which is not covered with the mask film;
    a second supply step of supplying a second gas into the chamber;
    a removal step of removing a modified layer formed on the surface of the first organic film which is not covered with the mask film by applying a first high frequency bias power to the stage and generating plasma of the second gas in the chamber; and
    an etching step of etching the first organic film below the removed modified layer by applying a second high frequency bias power lower than the first high frequency bias power to the stage and generating plasma of the second gas in the chamber.

* * * * *